United States Patent
Aoki et al.

(10) Patent No.: US 11,512,023 B2
(45) Date of Patent: Nov. 29, 2022

(54) SILICON NITRIDE SUBSTRATE AND SILICON NITRIDE CIRCUIT BOARD

(71) Applicants: KABUSHIKI KAISHA TOSHIBA, Tokyo (JP); TOSHIBA MATERIALS CO., LTD., Yokohama (JP)

(72) Inventors: Katsuyuki Aoki, Yokohama Kanagawa (JP); Takayuki Fukasawa, Yokohama Kanagawa (JP); Jun Momma, Yokohama Kanagawa (JP); Kentaro Iwai, Yokohama Kanagawa (JP)

(73) Assignees: KABUSHIKI KAISHA TOSHIBA, Tokyo (JP); TOSHIBA MATERIALS CO., LTD., Yokohama (JP)

( * ) Notice: Subject to any disclaimer, the term of this patent is extended or adjusted under 35 U.S.C. 154(b) by 0 days.

(21) Appl. No.: 17/119,406

(22) Filed: Dec. 11, 2020

(65) Prior Publication Data

US 2021/0130241 A1  May 6, 2021

Related U.S. Application Data (63) Continuation of application No. PCT/JP2019/030712, filed on Aug. 5, 2019.

(30) Foreign Application Priority Data

Aug. 29, 2018 (JP) .............................. JP2018-160246

(51) Int. Cl.
*H05K 1/03* (2006.01)
*C04B 35/584* (2006.01)

(52) U.S. Cl.
CPC ......... *C04B 35/584* (2013.01); *H05K 1/0306* (2013.01)

(58) Field of Classification Search
CPC ....... C04B 35/584; H05K 1/0306; H05K 1/03
USPC .......................................................... 174/255
See application file for complete search history.

(56) References Cited

U.S. PATENT DOCUMENTS

| | | |
|---|---|---|
| 2016/0251223 A1 | 9/2016 | Nakayama et al. |
| 2018/0002237 A1 | 1/2018 | Aoki |
| 2018/0005918 A1 | 1/2018 | Naba et al. |
| 2021/0122680 A1 | 4/2021 | Aoki et al. |
| 2021/0261467 A1 | 8/2021 | Funaki et al. |

FOREIGN PATENT DOCUMENTS

| | | |
|---|---|---|
| EP | 2301906 A1 | 3/2011 |
| EP | 3061739 A1 | 8/2016 |
| EP | 3248956 A1 | 11/2017 |
| EP | 3339270 A1 | 6/2018 |
| WO | WO-2015/060274 A1 | 4/2015 |
| WO | WO-2016/117553 A1 | 7/2016 |
| WO | WO-2017/056360 A1 | 4/2017 |

*Primary Examiner* — Tremesha S Willis
(74) *Attorney, Agent, or Firm* — Harness, Dickey & Pierce, P.L.C.

(57) ABSTRACT

In a silicon nitride substrate including a silicon nitride sintered body including silicon nitride crystal grains and a grain boundary phase, a plate thickness of the silicon nitride substrate is 0.4 mm or les, and a percentage of a number of the silicon nitride crystal grains including dislocation defect portions inside the silicon nitride crystal grains in a 50 μm×50 μm observation region of any cross section or surface of the silicon nitride sintered body is not less than 0% and not more than 20%. Etching resistance can be increased when forming the circuit board.

17 Claims, 2 Drawing Sheets

SILICON NITRIDE SUBSTRATE AND SILICON NITRIDE CIRCUIT BOARD

CROSS-REFERENCE TO RELATED APPLICATIONS

This is a continuation application of International Application PCT/JP2019/030712, filed on Aug. 5, 2019. This application also claims priority to Japanese Patent Application No. 2018-160246, filed on Aug. 29, 2018. The entire contents of which are incorporated herein by reference.

FIELD

Embodiments relate generally to a silicon nitride substrate, and a silicon nitride circuit board.

BACKGROUND

The output is increasing for power semiconductors of recent years. Also, the power density of power modules in which power semiconductors are mounted is increasing year by year. The module power density is determined by power density=$V_M \times I_M \times n/M_v$. Here, $V_M$ is the rated withstand voltage (V). $I_M$ is the rated current @ $\Delta T_{j-c}$=125° C. (A). n is the number of power semiconductors inside the module. Also, $M_v$ is the volume (cm$^3$) of the module.

To increase the power density of the power module, it is necessary to increase the number of power semiconductors inside the module or reduce the volume of the module. As described above, the output is increasing for semiconductor elements. Therefore, the heat generation amount also is increasing. Accordingly, it is desirable to improve the heat dissipation, the heat resistance, and the insulation properties of the insulating circuit board on which the semiconductor element is mounted.

International Publication No. 2015/060274 (Patent Literature 1) discusses a silicon nitride substrate. In Patent Literature 1, the fluctuation of the insulation properties is improved by controlling the distribution amount of the grain boundary phases in the thickness direction.

Patent Literature 1 shows the ratio of the volume specific resistance values when applying 1000 V between room temperature (25° C.) and 250° C. ρv2/ρv1 is 0.20 or more, where ρv1 is the volume specific resistance value at room temperature, and ρv2 is the volume specific resistance value at 250° C. Therefore, the silicon nitride substrate of Patent Literature 1 also has excellent insulative properties in a high-temperature environment.

On the other hand, the current is increasing for semiconductor elements. Heat resistance cycle characteristics (TCT) characteristics in a high-temperature environment are desirable for the circuit board on which the semiconductor element is mounted. International Publication No. 2017/056360 (Patent Literature 2) discusses a silicon nitride circuit board in which the shape of a copper plate side surface, the size and hardness of a brazing material jutting portion, and the like are controlled. Patent Literature 2 shows excellent durability in a TCT test from −40° C. to 250° C.

DETAILED DESCRIPTION

A silicon nitride substrate according to an embodiment includes a silicon nitride sintered body including silicon nitride crystal grains and a grain boundary phase, in which a plate thickness of the silicon nitride substrate is 0.4 mm or less, and a percentage of a number of the silicon nitride crystal grains that include dislocation defect portions in the interiors among any 50 silicon nitride crystal grains having completely visible contours in a 50 μm×50 μm observation region of any cross section or surface of the silicon nitride sintered body is not less than 0% and not more than 20%.

The silicon nitride sintered body includes silicon nitride crystal grains and a grain boundary phase. The grain boundary phase mainly includes the component of a sintering aid. The grain boundary phase is formed by a reaction of the sintering aid in the sintering process. The reaction occurs between the sintering aids, between the sintering aid and silicon nitride, or between the sintering aid and impurity oxygen.

In a silicon nitride substrate according to an embodiment, a percentage of a number of the silicon nitride crystal grains that include dislocation defect portions in the interiors among any 50 silicon nitride crystal grains having completely visible contours in a 50 μm×50 μm observation region is not less than 0% and not more than 20%.

The observation of the dislocation defects is performed for any cross section or surface of the silicon nitride sintered body.

Any cross section or surface of the silicon nitride sintered body is made by ion milling or FIB (focused-ion beam) processing to cause the surface roughness Ra to be 1 μm or less. The processed cross section or surface is used as the evaluation surface.

Then, the evaluation surface is observed using a transmission electron microscope (TEM). The magnification when observing by TEM is set to be 10000 times or more. The evaluation is performed by observing a 50 μm×50 μm region. The 50 μm×50 μm region may be observed by dividing the region into a plurality when the region cannot be observed in one field of view. In the evaluation, after observing one observation region (50 μm×50 μm), another region that is separated from the region by 1000 μm or more is observed. That is, the 50 μm×50 μm region is observed in two or more locations, and the percentage of the number of the silicon nitride crystal grains (the defective grains) including dislocation defect portions is calculated.

The existence or absence of dislocation defect portions is discriminated by observing the dark field and the bright field of the TEM observation image. The dislocation defect portion appears white in the dark field and is inverted and appears black in the bright field. Thus, a section where the pixel color inverts when switching between the dark field and the bright field is taken to be a dislocation defect portion.

Figure 1:
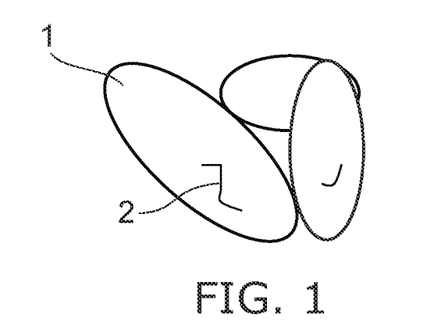
FIG. 1 is a conceptual view illustrating silicon nitride crystal grains that include dislocation defect portions.

FIG. 1 is a conceptual view illustrating silicon nitride crystal grains that include dislocation defect portions. In FIG. 1, 1 is a silicon nitride crystal grain. 2 is a dislocation defect portion. In the silicon nitride sintered body of the silicon nitride substrate according to the embodiment as shown in FIG. 1, the dislocation defect portion 2 may exist inside the silicon nitride crystal grain 1.

When there is a dislocation defect portion inside the silicon nitride crystal grain, the insulative properties of the silicon nitride substrate degrade. The dislocation defect portion is a crystal defect included inside the crystal. The crystal defect is also called a lattice defect (Lattice Defect). The crystal defect is caused by an impurity or a disturbance of the atomic arrangement. The dislocation defect portion causes the insulation properties to degrade because the dislocation defect portion occurs due to a defect occurring in the stable crystal structure. A small amount of dislocation defect portions does not have an unfavorable effect on the insulation properties. On the other hand, the dislocation defect portion is easily damaged by an etchant. When the dislocation defect portion is damaged, the dislocation defect portion propagates into a defect of the larger silicon nitride structure. The thickness of the silicon nitride substrate according to the embodiment is 0.40 mm or less. If a structure defect caused by the dislocation defect portion occurs in the surface of such a thin substrate, the insulative properties drastically degrade at that portion.

In the silicon nitride substrate according to the embodiment, the percentage of the number of the silicon nitride crystal grains that include dislocation defect portions in any 50 μm×50 μm micro region is not less than 0% and not more than 20%. The percentage in any 50 μm×50 μm observation region being not less than 0% and not more than 20% means that the percentage of the number is not less than 0% and not more than 20% no matter which 50 μm×50 μm region is observed.

The insulative properties of the silicon nitride substrate degrade when the percentage of the number of the silicon nitride crystal grains that include dislocation defect portions is greater than 20%. The plate thickness of the silicon nitride substrate according to the embodiment is 0.4 mm or less. Because the substrate is thin, the insulation properties degrade if there are many dislocation defect portions. If there is partial fluctuation of the insulation properties in the silicon nitride substrate as in Patent Literature 1, electric field concentration occurs in the portions having poor insulation properties. In Patent Literature 1, the distribution percentage of the grain boundary phase in the thickness direction of the substrate is controlled. Conversely, in the embodiment, the percentage of the number of the silicon nitride crystal grains that include dislocation defect portions is controlled.

Therefore, it is favorable for the percentage of the number of the silicon nitride crystal grains that include dislocation defect portions in the interiors among the silicon nitride crystal grains existing in a 50 μm×50 μm observation region to be not less than 0% and not more than 10%. Most favorably, the percentage is 0%. That is, the insulative properties of the silicon nitride substrate can be increased by having no silicon nitride crystal grains that include dislocation defect portions. Regions at two or more locations separated from each other by 1000 μm or more are used as the observed object. Also, a silicon nitride crystal grain that has a contour that is not completely visible in the TEM photograph of at least a portion of the 50 μm×50 μm observation region is not used to calculate the percentage of the number. For example, a silicon nitride crystal grain that has a contour that is partially cut off at the edge of the photograph is not used to calculate the percentage of the number. Also, when 50 silicon nitride crystal grains that have completely visible contours can be confirmed, the percentage of the number of the silicon nitride crystal grains that include dislocation defect portions among the 50 silicon nitride crystal grains is determined. That is, the observation is performed until 50 silicon nitride crystal grains that have completely visible contours can be confirmed. When 50 silicon nitride crystal grains that have completely visible contours cannot be observed in one 50 μm×50 μm observation region, 50 silicon nitride crystal grains that have completely visible contours are observed in another 50 μm×50 μm observation region. When more than 50 silicon nitride crystal grains are visible in the 50 μm×50 μm observation region, any 50 silicon nitride crystal grains are selected. In the silicon nitride sintered body according to the embodiment, the percentage of the number of the silicon nitride crystal grains that include dislocation defect portions among any 50 of the silicon nitride crystal grains is not less than 0% and not more than 20%. This means that when more than 50 silicon nitride crystal grains are visible in the 50 μm×50 μm observation region, the percentage of the number of the silicon nitride crystal grains that include dislocation defect portions is not less than 0% and not more than 20% no matter which of the 50 silicon nitride crystal grains are selected.

Also, it is favorable for no aggregate of a component other than silicon, oxygen, and nitrogen to be 1 μm2 or more in the dislocation defect portion. Also, it is favorable for no component other than silicon, oxygen, and nitrogen to be detected to be 10 mol % or more in the dislocation defect portion.

The component other than silicon, oxygen, and nitrogen is a component that includes a grain boundary phase. The grain boundary phase mainly includes a sintering aid. Therefore, a component other than silicon, oxygen, and nitrogen corresponds to a metal component of the sintering aid. For example, when yttrium oxide (Y2O3) is used as the sintering aid, the component other than silicon, oxygen, and nitrogen is yttrium (Y).

Also, no aggregate of a component other than silicon, oxygen, and nitrogen being not less than 1 μm2 means that aggregates of metal components included in the grain boundary phase are less than 1 μm2 (including 0 μm2) in the dislocation defect portion. Also, even when multiple sintering aids are used, it is favorable for no aggregate of a component other than silicon, oxygen, and nitrogen to be 1 μm2 or more. This means that a sintering aid component is not a kernel of the dislocation defect portion. Therefore, it is favorable for aggregates of metal components included in the grain boundary phase in the dislocation defect portion to be less than 1 μm2, and more favorably 0.2 μm2 or less.

Also, no component other than silicon, oxygen, and nitrogen being detected to be not less than 10 mol % means that the metal components of the sintering aid in the dislocation defect portion are less than 10 mol % (including 0 mol %). For example, when yttrium oxide (Y2O3) is used as the sintering aid, this means that yttrium (Y) is less than 10 mol % (including 0 mol %) in the dislocation defect portion. Also, when multiple sintering aids are used, it is favorable for the total of the metal components of the sintering aid to be less than 10 mol %. This means that a sintering aid component is not a kernel of the dislocation defect portion.

Also, it is favorable for aggregates of metal components included in the grain boundary phase in the dislocation defect portion to be less than 1 μm2 (including 0 μm2) and less than 10 mol % (including 0 mol %).

The durability for the etchant is improved by no sintering aid component being a kernel of the dislocation defect portion. The analysis of the size and concentration of the component other than silicon, oxygen, and nitrogen in the dislocation defect portion is performed by EDX (energy dispersive X-ray analysis) or WDS (wavelength dispersive X-ray analysis). Analysis may be performed in combination with an EPMA (electron probe microanalyzer).

Also, it is favorable for the percentage of the number of the silicon nitride crystal grains in which the occupied area ratio of the dislocation defect portion is 5% or less among the number of the silicon nitride crystal grains that include dislocation defect portions to be 70% or more. As described above, insulative property degradation is not caused if the number of the silicon nitride crystal grains that include dislocation defect portions is low. On the other hand, there is a possibility that the insulation properties may degrade if there is a large dislocation defect portion inside one silicon nitride crystal grain. Therefore, it is favorable for the occupied area ratio of the dislocation defect portion inside one silicon nitride crystal grain to be 5% or less. Also, when the percentage of the number of the silicon nitride crystal grains in which the occupied area ratio of the dislocation defect portion is 5% or less among the number of the silicon nitride crystal grains that include dislocation defect portions is 70% or more, the stress relaxation effect can be obtained without degrading the insulation properties. This percentage also is determined in a 50 μm×50 μm observation region.

That is, initially, any 50 silicon nitride crystal grains that have completely visible contours in one 50 μm×50 μm observation region are observed. Then, it is confirmed whether or not a dislocation defect portion exists in each of the 50 observed silicon nitride crystal grains. Also, the TEM observation magnification of the individual silicon nitride crystal grains is 10000 times. When one silicon nitride crystal grain does not fit within one image, the one image may be imaged by dividing into a plurality. The percentage of the number of the silicon nitride crystal grains that include dislocation defect portions among the 50 observed silicon nitride crystal grains is calculated. It is favorable for the percentage to be not less than 0% and not more than 20%. Continuing, when silicon nitride crystal grains that include dislocation defect portions exist, the occupied area ratio of the dislocation defect portion is calculated for each of the silicon nitride crystal grains. The percentage of the number of the silicon nitride crystal grains in which the occupied area ratio of the dislocation defect portion is 5% or less among the number of the silicon nitride crystal grains that include dislocation defect portions is calculated. It is favorable for the percentage to be 70% or more. When none of the 50 silicon nitride crystal grains have a completely visible contour in one 50 μm×50 μm observation region, the 50 silicon nitride crystal grains that have completely visible contours are searched in another 50 μm×50 μm observation region. After measuring the percentage of the number of the silicon nitride crystal grains that include dislocation defect portions, the occupied area ratio of the dislocation defect portion, etc., in one 50 μm×50 μm observation region, another 50 μm×50 μm observation region that is separated from the observation region by 1000 μm or more is observed. In the silicon nitride substrate according to the embodiment, the percentage of the number of the silicon nitride crystal grains that include dislocation defect portions is not less than 0% and not more than 20% for any 50 μm×50 μm observation region of any cross section. Also, the percentage of the number of the silicon nitride crystal grains in which the occupied area ratio of the dislocation defect portion is 5% or less is 70% or more.

In other words, in the silicon nitride substrate according to the embodiment, the size of the dislocation defect portion of the silicon nitride crystal grain is controlled even in a 50 μm×50 μm micro region.

Also, the dark-field image of the TEM photograph described above is used to measure the occupied area ratio of the dislocation defect portion inside one silicon nitride crystal grain. The dislocation defect portion is observed to be white in the dark-field image. In one silicon nitride crystal grain observed in the dark-field image, the total of the surface area of the region that appears white and the surface area of the region that appears black is used as the surface area of the silicon nitride crystal grain. The surface area of the region that appears white in the dark-field image is used as the surface area of the dislocation defect portion. (Dislocation defect portion surface area/silicon nitride crystal grain surface area)×100(%) is used as the occupied area ratio of the dislocation defect portion. Also, image processing software is used to measure the occupied area ratio. Image-j or image analysis software that has a resolution equal to or greater than that of Image-j is used as the image analysis software.

Also, in a 300 μm×300 μm observation region of any cross section of the silicon nitride sintered body, it is favorable for the major diameters of the silicon nitride crystal grains to be 60 μm or less, and more favorably 25 μm or less. Also, it is favorable for the average of the major diameters of the silicon nitride crystal grains in a 300 μm×300 μm observation region of any cross section of the silicon nitride sintered body to be within the range not less than 1 μm and not more than 10 μm. Also, it is favorable for the surface area of the individual grain boundary phases in a unit area of 300 μm×300 μm of any cross section of the silicon nitride sintered body to be 9 μm2 or less. The surface area of the grain boundary phase means the surface area of the region surrounded with the multiple silicon nitride crystal grains.

The major diameters of the silicon nitride crystal grains being 60 μm or less means that there is no silicon nitride crystal grain having a major diameter greater than 60 μm. That is, this refers to a state in which there is no large grain greater than 60 μm. As described above, the insulation properties are improved by reducing the number of dislocation defect portions. Because large grains do not exist, partial fluctuation of the insulation properties can be suppressed. Therefore, it is favorable for the major diameters of the silicon nitride crystal grains to be 60 μm or less, and more favorably 25 μm or less.

Also, it is favorable for the average of the major diameters of the silicon nitride crystal grains to be within the range not less than 1 μm and not more than 10 μm. When the average of the major diameters is less than 1 μm, the silicon nitride crystal grains are undesirably too small, and the thermal conductivity decreases. Also, when the average of the major diameters is greater than 10 μm, the thermal conductivity is improved, but there is a possibility that the strength may decrease.

Also, it is favorable for the surface area of the individual grain boundary phases in a 300 μm×300 μm observation region of any cross section of the silicon nitride substrate to be 9 μm2 or less. When the surface area of the grain boundary phase is greater than 9 μm2, there is a possibility that fluctuation of the insulation properties may be caused. The grain boundary phase and the silicon nitride crystal grain have different insulation properties. Therefore, when the grain boundary phases are too large, the effect of suppressing the effect of suppressing the dislocation defect portions of the silicon nitride crystal grains becomes small. Therefore, it is favorable for the surface area of the grain boundary phase to be 9 µm2 or less, and more favorably 5 µm2 or less.

The major diameters of the silicon nitride crystal grains and the surface area of the grain boundary phase are measured using a SEM photograph. A SEM photograph of any cross section of the silicon nitride substrate is taken. The cross section is made into a polished surface having a surface roughness Ra of 1 µm or less. The magnification of the SEM photograph is set to be 1000 times or more. The recommended magnification of the SEM photograph is 4000 times. When a 300 µm×300 µm region cannot be imaged in one field of view, a 300 µm×300 µm region may be imaged by dividing into a plurality. When the length in one direction of the cross section is less than 300 µm, a 90000 µm2 observation region is observed after setting the length of the observation region in the one direction to be as long as possible. The major diameters of the silicon nitride crystal grains are measured based on the observation result in the 90000 µm2 observation region.

Figure 2:
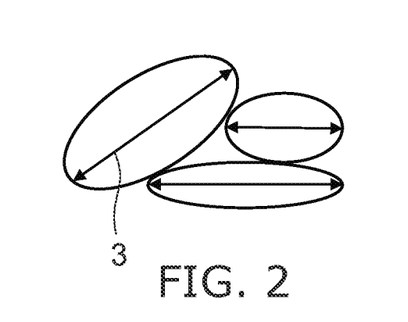
FIG. 2 is a conceptual view illustrating the major diameters of the silicon nitride crystal grains.

As shown in FIG. 2, the major diameter is the length of the longest line segment among the line segments obtained by connecting any two points on the outer edge of one silicon nitride crystal grain. The major diameters of the individual silicon nitride crystal grains visible in the SEM photograph of a 300 µm×300 µm observation region are measured. The silicon nitride crystal grains that have contours that are partially cut off at the edge of the SEM photograph and are not completely visible are not counted. In FIG. 2, 3 is the major diameter of the silicon nitride crystal grain 1. It is favorable for the maximum value of the major diameters to be 60 µm or less, and more favorably 25 µm or less. Also, the average of the major diameters of the individual silicon nitride crystal grains is calculated. It is favorable for the average of the major diameters to be not less than 1 µm and not more than 10 µm.

In the SEM photograph, the silicon nitride crystal grain and the grain boundary phase can be discriminated using the contrast difference. The silicon nitride crystal grain is dark gray, and the grain boundary phase is light gray. The surface area of the grain boundary phase can be determined by image analysis of the SEM photograph. Specifically, a binarized image is analyzed using image analysis software. In the binary image, the silicon nitride crystal grains are black, and the grain boundary phases are white. A region that is surrounded with three or more silicon nitride crystal grains is taken to be a grain boundary phase, and the surface area is determined. That is, the surface area is determined by excluding the grain boundary phases existing between two silicon nitride crystal grains. Also, Image-j or image analysis software that has a resolution equal to or greater than that of Image-j is used as the image analysis software.

By having the configuration described above, the thermal conductivity can be 80 W/(m·K) or more, and the three-point bending strength can be 600 MPa or more. That is, the insulation properties can be improved without reducing the thermal conductivity and the strength.

The thermal conductivity is measured according to the flash method of JIS-R-1611 (2010). JIS-R-1611 (2010) corresponds to ISO 18755 (2005). Also, the three-point bending strength is measured according to JIS-R-1601 (2008). JIS-R-1601 (2008) corresponds to ISO 14704 (2000).

It is favorable for the oxide-converted sintering aid content to be 15 mass % or less. When the sintering aid content is greater than 15 mass %, the percentage of the grain boundary phase increases, and the effect of reducing the silicon nitride crystal grains that include dislocation defects decreases. Also, it is favorable for the sintering aid to be one, two, or more selected from a rare-earth element, magnesium, titanium, hafnium, aluminum, and calcium. The total amount of the simple metals when converted into their oxides is set to be 15 mass % or less. It is favorable for the sintering aid content to be 0.1 mass % or more. When the sintering aid content is less than 0.1 mass %, there is a possibility that the addition effect may be insufficient. Therefore, it is favorable for the oxide-converted sintering aid content to be not less than 0.1 mass % and not more than 15 mass %, and more favorably not less than 2 mass % and not more than 10 mass %.

Also, it is favorable for the plate thickness of the silicon nitride substrate to be not less than 0.1 mm and not more than 0.4 mm. Also, it is favorable to be a silicon nitride circuit board in which a circuit part is provided in the silicon nitride substrate.

The silicon nitride substrate is for mounting a semiconductor element. A method of providing a circuit part is an example of a method for mounting the semiconductor element. Also, there is a method in which the semiconductor element is pressure-welded to the silicon nitride substrate.

It is favorable for the silicon nitride substrate according to the embodiment to be used in a silicon nitride circuit board including a circuit part. A method of bonding a metal plate by using a brazing material, a metalizing method that uses a metal paste, etc., are examples of the method of forming the circuit part.

Active metal bonding is an example of the method of bonding the metal plate by using a brazing material.

When the metal plate is a copper plate, the active metal includes one, two, or more selected from Ti (titanium), Hf (hafnium), Zr (zirconium), and Nb (niobium). An active metal, Ag (silver), and Cu (copper) are mixed and used as the active metal brazing material. Also, one, two, or more selected from Sn (tin), In (indium), and C (carbon) may be added as necessary.

Also, among the active metals, Ti (titanium) is favorable. The bonding strength can be increased by Ti reacting with the silicon nitride substrate and forming titanium nitride (TiN). Ti has good reactivity with the silicon nitride substrate and can increase the bonding strength.

Also, when Ag+Cu+active metal=100 mass %, it is favorable to be within the ranges of a content ratio of Ag that is not less than 40 mass % and not more than 80 mass %, a content ratio of Cu that is not less than 15 mass % and not more than 60 mass %, and a content ratio of Ti that is not less than 1 mass % and not more than 12 mass %. Also, when In and Sn are added, it is favorable for the content ratio of at least one element selected from In and Sn to be in the range not less than 5 mass % and not more than 20 mass %. When C is added, it is favorable for the content ratio of C to be in the range not less than 0.1 mass % and not more than 2 mass %. That is, when Ag+Cu+Ti+Sn (or In)+C=100 mass %, it is favorable to be within the ranges of a content ratio of Ag that is not less than 40 mass % and not more than 73.9 mass %, a content ratio of Cu that is not less than 15 mass % and not more than 45 mass %, a content ratio of Ti that is not less than 1 mass % and not more than 12 mass %, a content ratio of Sn (or In) that is not less than 5 mass % and not more than 20 mass %, and a content ratio of C that is not less than 0.1 mass % and not more than 2 mass %. Here, the composition of a brazing material that uses Ti is described, but a portion or all of the Ti may be replaced with another active metal.

Also, when the metal plate is an aluminum plate, the active metal is one or two elements selected from Si (silicon) or Mg (magnesium). These active metals and Al (aluminum) are mixed and used as the active metal brazing material.

The active metal brazing material is coated onto the silicon nitride substrate, and the metal plate is disposed. Then, the metal plate is bonded to the silicon nitride substrate by heating the silicon nitride substrate on which the metal plate is disposed to not less than 600° C. and not more than 900° C. The copper plate or the aluminum plate can be bonded thereby. Also, when bonding, it is favorable to be heated in a vacuum (10-2 Pa or less). A circuit pattern may be formed by an etching process or the like as necessary.

Also, a metalizing method that uses a metal paste includes a method of coating a metal paste of Cu (copper), Al (aluminum), W (tungsten), Mo (molybdenum), etc., and forming the circuit part by heating.

In the method of bonding the metal plate, a metal plate that has a thick plate thickness can be bonded to the substrate. The current-carrying capacity can be increased thereby. On the other hand, processes such as etching, etc., become necessary to form the circuit pattern. Also, the metallizing can coat a paste at the location at which the circuit pattern is to be formed. Therefore, a pattern can be formed to have a complex shape. On the other hand, it is difficult to increase the current-carrying capacity because it is difficult to make the circuit part thick. A method of using metal plating also is one type of metallizing. The method for forming the circuit part can be selected as appropriate according to the purpose.

When using the metal plate on the circuit part as described above, two types of etching, i.e., the etching of the metal plate and the etching of the brazing material layer, are necessary.

For example, cupric chloride or ferric chloride is used when etching the copper plate. Also, aqueous hydrogen peroxide, ammonium fluoride, hydrogen fluoride, or the like is used when etching the active metal brazing material layer. Also, there are also cases where an acid solution of sulfuric acid, hydrochloric acid, nitric acid, or the like is used as a chemical polishing liquid. Also, there are cases where the silicon nitride circuit board is immersed in a chemical liquid to remove the etching resist. Thus, the silicon nitride circuit board is exposed to two, three, or more types of chemical liquids. Also, there are cases where the number of times etching is performed is increased to optimize the side surface shape of the copper plate and/or the size of the brazing material jutting portion. In particular, when the thickness of the copper plate is thick and is 0.8 mm or more, it is necessary to increase the number of times etching is performed, lengthen the etching time, increase the etchant concentration, etc. Also, normally, an etchant that has a pH of about 5 to 6 is used as the etchant of the active metal brazing material. The etching time also can be shortened by using an etchant having a pH of 5 or less, combining with a chemical polishing liquid having a pH of about 1, etc. Therefore, there is a tendency to increase etching processes that use etchants having a pH of 5 or less. However, the etching load on the silicon nitride substrate due to the etching of the active metal brazing material also is large.

In the silicon nitride substrate according to the embodiment, the damage of the silicon nitride crystal grains due to the etching can be reduced because the dislocation defect portions are reduced. Therefore, the reduction of the insulative properties of the silicon nitride substrate due to the etching can be suppressed. Therefore, the silicon nitride substrate according to the embodiment is favorable for a silicon nitride circuit board that uses, in the circuit part, a metal plate that has a thickness of 0.8 mm or more that has a particularly increased etching load. Also, the thermal resistance of the silicon nitride substrate can be reduced by thinning the plate thickness of the silicon nitride substrate to be 0.40 mm or less. Also, the thermal resistance can be lowered by thinning the plate thickness of the silicon nitride substrate to be 0.30 mm or less. The silicon nitride substrate according to the embodiment has excellent durability for the etchant because the dislocation defect portions are reduced. Therefore, even when the plate thickness of the silicon nitride substrate is thin, the degradation of the insulation properties due to the etching can be suppressed. It is favorable for the plate thickness of the silicon nitride substrate to be 0.1 mm or more. When the plate thickness is less than 0.1 mm, the strength of the silicon nitride substrate decreases.

A method for manufacturing a silicon nitride substrate according to an embodiment will now be described. The method for manufacturing the silicon nitride substrate is not limited to the following example. The following manufacturing method is an example of a method for obtaining the silicon nitride substrate with a high yield.

First, a raw material powder is prepared. A silicon nitride powder and a sintering aid powder are necessary as raw material powders. It is favorable for the sintering aid to be one, two, or more selected from a rare-earth element, magnesium, titanium, hafnium, aluminum, and calcium. The total amount of the simple metals when converted into their oxides is set to be 15 mass % or less. It is favorable for the lower limit of the added amount of the sintering aid to be 0.1 mass % or more. When the sintering aid amount is less than 0.1 mass %, there is a possibility that the addition effect may be insufficient. Therefore, it is favorable for the added amount of the sintering aid to be not less than 0.1 mass % and not more than 15 mass %.

Also, it is favorable for the silicon nitride powder to have a gelatinization ratio of 80 mass % or more, an average particle size that is not less than 0.4 μm and not more than 2.5 μm, and an impurity oxygen content of 2 mass % or less. It is favorable for the impurity oxygen content to be 1.0 mass % or less, and more favorably not less than 0.1 mass % and not more than 0.8 mass %. When the impurity oxygen content is greater than 2 mass %, there is a possibility that the impurity oxygen and the sintering aid may react, and grain boundary phases may be formed more than necessary.

Also, it is favorable for the sintering aid to include a rare-earth compound. The rare-earth compound is an important material for the major diameter control of the silicon nitride crystal grain. It is favorable to control the oxide-converted added amount of the rare-earth compound powder to be not less than 3 mass % and not more than 10 mass %, and more favorably not less than 5 mass % and not more than 9 mass %. The oxide conversion is a conversion using $R_2O_3$ when R is a rare-earth element.

Also, in a process in which grain growth of the silicon nitride crystal grains occurs, it is necessary to form a state in which the rare-earth element is easily coordinated to the surface of the silicon nitride crystal grain. The coordination to the surface is when a rare-earth element (including a rare-earth element compound) is adjacent to the surface elements of the silicon nitride. By coordinating the rare-earth element to the surface of the silicon nitride crystal grain, the reaction between the silicon nitride crystal grain and the rare-earth element and the reaction between the sintering aids can be promoted. A fine powder form is favorable as the raw material powder, and it is favorable to control an average particle size D50 to be 1.0 µm or less, and more favorably 0.4 µm or less. Also, an effective technique is to perform wet mixing with a solution of an alkoxide compound, etc., instead of a powder, and chemically bond the rare-earth element to the silicon nitride crystal grain surface.

Also, a powder of a compound including one, two, or more selected from magnesium, titanium, hafnium, aluminum, and calcium is added as necessary. Also, it is favorable for the total of the added amounts of these compounds to be 5 mass % or less. Also, it is favorable for these compounds to be oxides or carbon oxides. When oxygen is included as an elemental component of the sintering aid, an oxide liquid phase is formed by a reaction between the sintering aids or a reaction between the impurity oxygen and the sintering aid inside the silicon nitride powder. The densification of the silicon nitride crystal grains can be promoted thereby.

The rare-earth compound has an effect of promoting the sintering. Also, the compound that includes magnesium, titanium, hafnium, aluminum, or calcium has an effect of lowering the sintering temperature, strengthening the grain boundary phase, etc.

A raw material mixture is prepared by mixing the raw material powders described above and by adding a binder. The raw material powder is a mixed powder of the silicon nitride powder and the sintering aid powder. To control the grain growth of the silicon nitride crystal grains in the sintering process, it is necessary to uniformly mix the mixed powder. A mixing process pulverizes and mixes using ball milling, etc. If the pulverizing stress is too large, dislocation defect portions are undesirably formed in the silicon nitride powder, and dislocation defect portions more easily remain in the silicon nitride grains after sintering. Therefore, it is favorable to perform the mixing process for not less than 20 hours so that the average particle size D50 becomes 1 µm or less. Also, although the upper limit of the mixing time is not particularly limited, it is favorable to be 60 hours or less. The mixing may exceed 60 hours, but the manufacturing time becomes too long. It is favorable to use a laser scattering particle size distribution analyzer (made by Horiba, Ltd.) to measure the average particle size D50.

Then, a forming process of forming the raw material mixture is performed. General-purpose die pressing, cold isostatic pressing (CIP), sheet forming (e.g., a doctor blade method or roll forming), etc., are applicable as the forming technique of the raw material mixture. Also, the raw material mixture is mixed with a solvent such as toluene, ethanol, butanol, etc., as necessary. The doctor blade method is suited to mass production of a substrate having a thickness of 0.40 mm or less.

Then, a degreasing process of the formed body is performed after the forming process described above. In the degreasing process, the greater part of the organic binder that was pre-added is degreased by heating in a nonoxidizing atmosphere at a temperature not less than 500° C. and not more than 800° C. for not less than 1 hour and not more than 4 hours. A nitrogen gas atmosphere, an argon gas atmosphere, etc., are examples of the nonoxidizing atmosphere. If necessary, the organic substance amount that remains in the degreased body is controlled by processing in an oxidation atmosphere such as an ambient-air atmosphere, etc.

Also, butyl methacrylate, polyvinyl butyral, polymethyl methacrylate, etc., are examples of the organic binder. Also, when the raw material mixture (the total amount of the silicon nitride powder and the sintering aid powder) is taken as 100 mass %, it is favorable for the added amount of the organic binder to be not less than 3 mass % and not more than 28 mass %.

When the added amount of the organic binder is less than 3 mass %, the binder amount is too low, and it is difficult to maintain the shape of the formed body. In such a case, it is difficult to improve the suitability for mass production by increasing the layers of the formed body.

On the other hand, when the binder amount is high and is greater than 28 mass %, voids in the formed body after the degreasing treatment by the degreasing process become large, and pores of the silicon nitride substrate become large. Therefore, it is favorable for the added amount of the organic binder to be within the range not less than 3 mass % and not more than 28 mass %, and more favorably not less than 3 mass % and not more than 17 mass %.

Then, the formed body after the degreasing treatment is placed inside a firing container, and a sintering process is performed in a nonoxidizing atmosphere inside a furnace. It is favorable for the temperature in the sintering process to be within the range not less than 1800° C. and not more than 1950° C. It is favorable for the nonoxidizing atmosphere to be a nitrogen gas atmosphere or a reducing atmosphere including nitrogen gas. Also, it is favorable for the interior of the furnace to be a pressurized atmosphere.

If the firing is performed in a low-temperature state in which the sintering temperature is less than 1800° C., the grain growth of the silicon nitride crystal grains is insufficient, and a dense sintered body is difficult to obtain. On the other hand, if the sintering temperature of the firing is a higher temperature than 1950° C., there is a possibility that silicon nitride may decompose into Si and N2 when the furnace atmosphere pressure is low. Therefore, it is favorable to control the sintering temperature to be within the ranges described above. Also, it is favorable for the sintering time to be within the range not less than 7 hours and not more than 20 hours.

When performing the sintering process, it is favorable for the heating rate from 1350° C. to 1600° C. to be 50° C./h or less. In the temperature range of 1350° C. to 1600° C., the liquid phase that is mainly the sintering aid is formed. Therefore, the diffusion of the liquid phase to the silicon nitride crystal grain surface can be promoted by controlling the heating rate.

Also, it is favorable for the heating rate from 1650° C. to the sintering temperature to be 50° C./h or less. By setting the heating rate to be 50° C./h or less, uniform grain growth can be promoted, the formation of large grains can be suppressed, and the formation of dislocation defect portions in the silicon nitride crystal grains can be suppressed.

Also, the heating rate from 1300° C. to 1650° C. is taken as a first heating rate. The heating rate from 1650° C. to the sintering temperature is taken as a second heating rate. It is favorable for the first heating rate to be not less than the second heating rate. By setting the second heating rate to be equal to or slower than the first heating rate, the effect of suppressing the formation of large grains can be improved. The grain growth progresses via the liquid phase diffused to the silicon nitride crystal grain surface. Thereby, homogeneous grain growth is promoted by maintaining the heating rate from 1650° C. to the sintering temperature at the first heating rate that is effective for diffusing the liquid phase or by setting the heating rate to be the second heating rate that is slower than the first heating rate that is effective for diffusing the liquid phase. The effect of suppressing the formation of large grains can be improved thereby.

Also, it is favorable to control the pressure in the sintering process so that the change amount of the pressure is 0.3 MPa or less. By suppressing the change amount of the pressure as well, the formation of dislocation defect portions in the silicon nitride crystal grains can be suppressed. The change of the pressure affects the grain growth of the silicon nitride crystal grains. When the sintering process is performed at atmospheric pressure or is pressurized, it is favorable for the change amount of the pressure to be 0.3 MPa or less, and more favorably 0.1 MPa or less. To control the change amount of the pressure, it is effective to control the gas pressure in the sintering atmosphere. Gas is easily produced in the sintering process of the silicon nitride substrate. In the sintering process, the binder inside the formed body, the sintering aid, the impurity oxygen inside the silicon nitride powder, etc., become gas components. The pressure of the sintering atmosphere changes due to the gas components that are produced. That is, even in pressureless sintering in which pressure is not particularly applied, the pressure of the sintering atmosphere changes due to the gas components that are produced. Therefore, a control is necessary to remove the gas components that are produced, etc., so the atmosphere pressure does not change in the sintering process. In particular, it is favorable for the change amount of the pressure between the heat treatment process of 1300° C. or more to the sintering process to be 0.3 MPa or less.

Thus, abnormal grain growth of the silicon nitride crystal grains can be suppressed by the control of the heating rate or the suppression of the pressure change.

Thereby, the maximum value of the major diameters of the silicon nitride crystal grains in a 300 μm×300 μm observation region of any cross section of the silicon nitride sintered body can be controlled to be 60 μm or less, and more favorably 25 μm or less. Also, the average of the major diameters of the silicon nitride crystal grains in a 300 μm×300 μm observation region of any cross section of the silicon nitride sintered body can be controlled within the range not less than 1 μm and not more than 10 μm. Also, because abnormal grain growth can be suppressed, the surface area of the individual grain boundary phases in a 300 μm×300 μm observation region of any cross section of the silicon nitride sintered body can be controlled to be 9 μm2 or less, and more favorably 5 μm2 or less.

Also, the cooling rate after the sintering process can be set as appropriate. To promote the crystallization of the grain boundary phase, it is favorable for the cooling rate to be 100° C./h or less.

Figure 3:
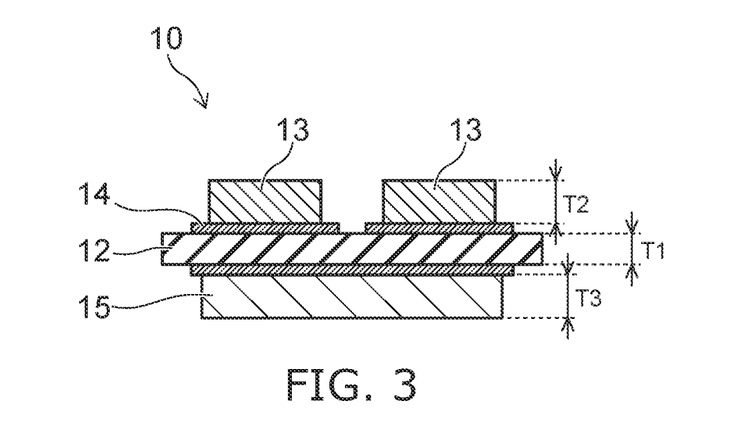
FIG. 3 is a drawing showing one example of a silicon nitride circuit board according to an embodiment.
Figure 4:
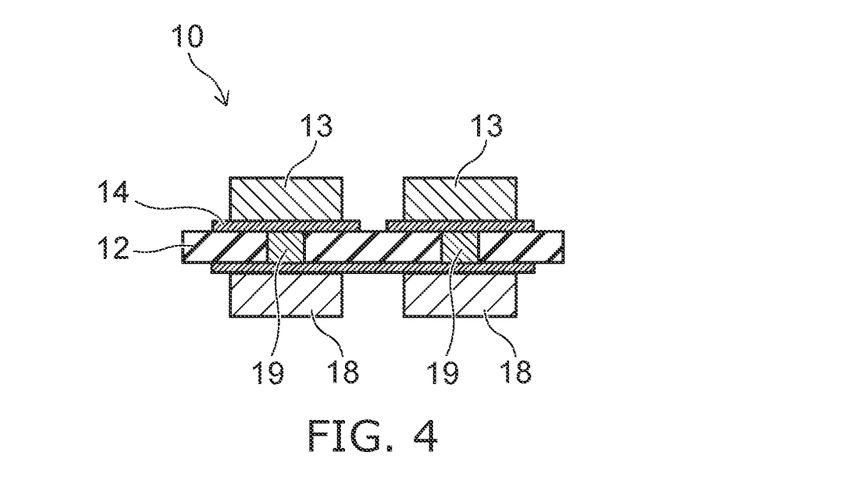
FIG. 4 is a drawing showing another example of a silicon nitride circuit board according to the embodiment.
Figure 5:
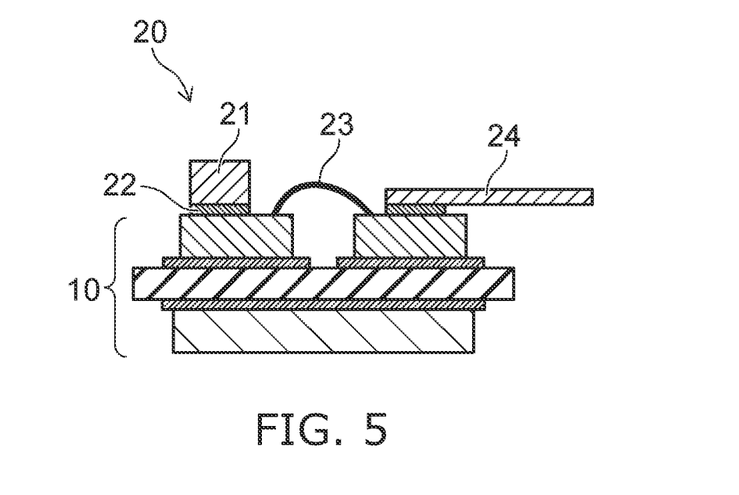
FIG. 5 is a drawing showing one example of a semiconductor device according to the embodiment.

FIGS. 3 to 5 are drawings showing examples of silicon nitride circuit boards according to an embodiment. In FIG. 3, 10 is a silicon nitride circuit board. 12 is a silicon nitride substrate. 13 is a front metal plate. 14 is a bonding layer. 15 is a back metal plate. FIG. 3 shows an example in which two front metal plates 13 are bonded to the silicon nitride substrate 12. The embodiment is not limited to such a form; one, three, or more front metal plates 13 may be bonded to the silicon nitride substrate 12. Each front metal plate 13 may be patterned into a wiring pattern. In the example of FIG. 3, the back metal plate 15 also is bonded to the silicon nitride substrate 12. The back metal plate 15 functions as a heat dissipation plate that is not a circuit. The back metal plate 15 can be provided as necessary.

A through-hole may be provided in the silicon nitride substrate. It is favorable for the silicon nitride circuit board to have a structure in which the metal plate at the front and the metal plate at the back are electrically connected via the through-hole. FIG. 4 shows an example of a silicon nitride circuit board that has a through-hole. FIG. 4 is a cross-sectional view at a portion where the through-hole is provided. In FIG. 4, 10 is the silicon nitride circuit board. 12 is the silicon nitride substrate. 13 is the front metal plate. 14 is the bonding layer. 18 is the back metal plate. 19 is the through-hole. In FIG. 4, the front metal plate 13 and the back metal plate 18 are electrically connected via the through-hole 19. In FIG. 4, multiple through-holes 19 connect multiple front metal plates 13 and multiple back metal plates 18. The embodiment is not limited to such a structure. In the silicon nitride circuit board 10, the through-hole 19 may be provided for only a portion of the multiple front metal plates 13. The through-hole 19 may be provided for only a portion of the multiple back metal plates 18. It is favorable for the same material as the bonding layer 14 to be filled into the through-hole 19. The structure inside the through-hole 19 is not particularly limited as long as the front metal plate and the back metal plate can be electrically connected. Therefore, a metal thin film may be provided at only the through-hole 19 inner wall. On the other hand, the bonding strength can be increased by filling with the same material as the bonding layer 14.

The silicon nitride circuit board according to the embodiment is favorable in a semiconductor device. In the semiconductor device, the semiconductor element is mounted to the metal plate of the silicon nitride circuit board via the bonding layer. FIG. 5 shows an example of the semiconductor device. In FIG. 5, 10 is a silicon nitride circuit board. 20 is a semiconductor device. 21 is a semiconductor element. 22 is a bonding layer. 23 is wire bonding. 24 is a metal terminal. In FIG. 5, the semiconductor element 21 is bonded onto the metal plate of the silicon nitride circuit board 10 via the bonding layer 22. Similarly, the metal terminal 24 is bonded via the bonding layer 22. The wire bonding 23 electrically connects between the adjacent metal plates. In FIG. 5, other than the semiconductor element 21, the wire bonding 23 and the metal terminal 24 are bonded. The semiconductor device according to the embodiment is not limited to such a structure. For example, only one of the wire bonding 23 or the metal terminal 24 may be provided. A plurality of each of the semiconductor element 21, the wire bonding 23, and the metal terminal 24 may be provided at each of the front metal plates 13. The semiconductor element 21, the wire bonding 23, and the metal terminal 24 can be bonded to the back metal plate 18 as necessary. Various shapes such as a leadframe shape, a protruding shape, etc., are applicable to the metal terminal 24.

Solder, a brazing material, etc., are examples of the bonding layer 22 bonding the semiconductor element 21 or the metal terminal 24. It is favorable for the solder to be lead-free solder. It is favorable for the melting point of the solder to be 450° C. or less. It is favorable for the melting point of the brazing material to be 450° C. or less. A brazing material that has a melting point of 500° C. or more is called a high-temperature brazing material. An example of a high-temperature brazing material includes Ag as a major component.

EXAMPLE

Examples 1 to 5 and Reference Example 1

A mixed raw material powder was prepared in which a silicon nitride powder and a sintering aid powder were mixed. Then, mixed raw material powders 1 to 3 were prepared by pulverizing and mixing the mixed raw material powder. The pulverizing and mixing was performed using a ball mill. The results are shown in Table 1.

TABLE 1

|  | MIXING RATIO (wt %) | AVERAGE PARTICLE SIZE $D_m$ BEFORE PULVERIZING AND MIXING (μm) | AVERAGE PARTICLE SIZE $D_m$ AFTER PULVERIZING AND MIXING (μm) | PULVERIZING TIME (h) |
|---|---|---|---|---|
| MIXED RAW MATERIAL POWDER 1 | Si3N4 (90) Y2O3 (4) Er2O3 (4) HfO2 (1) MgO (0.5) TiO2 (0.5) | 1.2 | 0.9 | 40 |
| MIXED RAW MATERIAL POWDER 2 | Si3N4 (92) Y2O3 (6) HfO2 (1.2) MgO (0.8) | 1.4 | 1.0 | 30 |
| MIXED RAW MATERIAL POWDER 3 | Si3N4 (93) Y2O3 (4) MgO (3) | 1.5 | 1.1 | 25 |
| MIXED RAW MATERIAL POWDER 4 | Si3N4 (92) Y2O3 (4) MgO (4) | 1.3 | 1.0 | 10 |

For the mixed raw material powders 1 to 3, the pulverizing and mixing was performed for not less than 20 hours until the average particle size D50 became 80%. Also, for a mixed raw material powder 4, the pulverizing and mixing was performed in a short period of time for 10 hours until the average particle size D50 became 1 μm. A laser scattering particle size distribution analyzer (made by Horiba, Ltd.) was used to measure the average particle size D50.

Then, mixed raw material pastes were adjusted by adding a binder that was not less than 5 mass % and not more than 10 mass % to the mixed raw material powders. Sheet forming was performed using the mixed raw material pastes and a doctor blade method. Degreased bodies were prepared by performing a degreasing process of the sheet-formed bodies at not less than 500° C. and not more than 800° C. for not less than 1 hour and not more than 4 hours.

Then, the sintering processes shown in Table 2 were performed in a nitrogen atmosphere. Also, silicon nitride substrates that were 50 mm long×40 mm wide were obtained by singulating the silicon nitride substrate after the sintering process. Also, a pressure of 0.1 MPa refers to atmospheric pressure.

TABLE 2

|  | MIXED RAW MATERIAL POWDER | SUBSTRATE THICKNESS (mm) | HEATING RATE FROM 1300° C. TO 1650° C. (° C./h) | HEATING RATE FROM 1650° C. TO SINTERING TEMPERATURE (° C./h) | SINTERING PROCESS TEMPERATURE (° C.) × TIME(h) × PRESSURE (MPs) | PRESSURE CHANGE AMOUNT FROM HEAT TREATMENT PROCESS TO SINTERING PROCESS (MPs) | COOLING RATE AFTER SINTERING PROCESS (° C./h) |
|---|---|---|---|---|---|---|---|
| EXAMPLE 1 | MIXED RAW MATERIAL POWDER 1 | 0.32 | 50 | 50 | 1830 × 13 × 0.1 | 0 | 100 |
| EXAMPLE 2 | MIXED RAW MATERIAL POWDER 1 | 0.25 | 30 | 30 | 1870 × 10 × 0.3 | 0.2 | 50 |
| EXAMPLE 3 | MIXED RAW MATERIAL POWDER 2 | 0.20 | 40 | 40 | 1830 × 8 × 0.5 | 0 | 100 |
| EXAMPLE 4 | MIXED RAW MATERIAL POWDER 2 | 0.32 | 20 | 20 | 1850 × 9 × 0.2 | 0.1 | 50 |
| EXAMPLE 5 | MIXED RAW MATERIAL POWDER 3 | 0.32 | 50 | 50 | 1920 × 10 × 0.1 | 0 | 500 |

TABLE 2-continued

|  | MIXED RAW MATERIAL POWDER | SUBSTRATE THICKNESS (mm) | HEATING RATE FROM 1300° C. TO 1650° C. (° C./h) | HEATING RATE FROM 1650° C. TO SINTERING TEMPERATURE (° C./h) | SINTERING PROCESS TEMPERATURE (° C.) × TIME(h) × PRESSURE (MPs) | PRESSURE CHANGE AMOUNT FROM HEAT TREATMENT PROCESS TO SINTERING PROCESS (MPs) | COOLING RATE AFTER SINTERING PROCESS (° C./h) |
|---|---|---|---|---|---|---|---|
| EXAMPLE 6 | MIXED RAW MATERIAL POWDER 1 | 0.25 | 45 | 30 | 1860 × 10 × 0.2 | 0.1 | 50 |
| EXAMPLE 7 | MIXED RAW MATERIAL POWDER 2 | 0.32 | 45 | 45 | 1930 × 12 × 0.2 | 0.2 | 50 |
| REFERENCE EXAMPLE 1 | MIXED RAW MATERIAL POWDER 4 | 0.32 | 100 | 100 | 1880 × 10 × 0.5 | 0.4 | 100 |

The dislocation defect portions, the major diameters of the silicon nitride crystal grains, the surface area of the grain boundary phase, the thermal conductivity, the three-point bending strength, the fracture toughness value, and the breakdown voltage were measured for the silicon nitride substrates according to the examples and the reference example.

In the measurement of the dislocation defect portions, an arbitrary cross section was made by ion milling with a surface roughness Ra of 1 μm or less and was used as the evaluation surface. The evaluation surface was observed by TEM. In the observation by TEM, multiple mutually-adjacent regions in 50 μm×50 μm arbitrary observation regions were sequentially imaged. The magnification when imaging the TEM photographs was set to 10000 times, and the bright-field image and the dark-field image were imaged. The regions that appeared to be white in the dark-field image were taken to be dislocation defect portions. The existence or absence of dislocation defect portions and the occupied area ratio inside one silicon nitride crystal grain were determined by comparing the bright-field image and the dark-field image. Also, the occupied area ratio of the dislocation defect portion was measured by using image processing software to binarize the dark-field image and by determining (white pixel aggregate surface area/(white pixel aggregate surface area+black pixel aggregate surface area))× 100. The observation of one 50 μm×50 μm observation region was performed until 50 silicon nitride crystal grains that had completely visible contours were confirmed. The silicon nitride crystal grains that were partially cut off at the end portion of the TEM photograph (i.e., the silicon nitride crystal grains that did not have completely visible contours) were excluded from the count of the percentage of the number. When 50 silicon nitride crystal grains that had completely visible contours could be confirmed, another observation region was observed by TEM, even when the entire 50 μm×50 μm observation region had not been observed. As the other observation region, a region that was separated from the observation region directly before by 1000 μm or more was selected. Observation regions at a total of two or more locations were imaged. Image-j was used as the image analysis software.

Also, the elements at the kernels of the dislocation defect portions were analyzed. EDX was used to analyze the dislocation defect portions. Thereby, it was measured, for an element other than silicon, oxygen, and nitrogen in the dislocation defect portion, whether or not an aggregate was 1 μm2 or more, and whether or not 10 mol % or more was detected.

Also, the major diameters of the silicon nitride crystal grains were measured based on a SEM observation in an arbitrary cross section. The magnification when imaging the SEM photograph was set to 3000 times, and a 300 μm×300 μm region was imaged. In the SEM photograph, the length of the longest line segment among the line segments obtained by connecting any two points on the outer edge of one silicon nitride crystal grain was used as the major diameter. The average of the major diameters of the silicon nitride crystal grains in the SEM photograph (the 300 μm×300 μm observation region) was determined. Also, the longest of the major diameters of the silicon nitride crystal grains was extracted as the maximum value of the major diameters.

Also, a binary image was analyzed by using image analysis software to binarize the SEM photograph (the 300 μm×300 μm observation region) described above. Regions that were surrounded with three or more silicon nitride crystal grains in the binary image were taken to be grain boundary phases, and the surface areas were determined. Also, Image-j was used as the image analysis software.

The thermal conductivity was measured according to the flash method of JIS-R-1611 (2010). JIS-R-1611 (2010) corresponds to ISO 18755 (2005). The three-point bending strength was measured according to JIS-R-1601 (2008). Also, the fracture toughness was measured using Niihara's equation according to the IF method of JIS-R-1607 (2015). The breakdown voltage was measured using a two-terminal technique according to JIS-C-2141. JIS-C-2141 corresponds to IEC672-2 (1980). A plane electrode having a tip diameter of 25 mm was used as the measurement terminal to measure the breakdown voltage. Also, the measurement of the dielectric strength was performed inside Fluorinert.

The results are shown in Tables 3 and 4.

reference example by using an active metal brazing material. An active metal brazing material that was made of Ag (60 mass %), Cu (28 mass %), Sn (9 mass %), and Ti (3 mass %) was used. Also, the thickness of the active metal bonding layer was set to 30 μm.

TABLE 3

| | DISLOCATION DEFECT PORTION | | | |
|---|---|---|---|---|
| | PERCENTAGE OF NUMBER OF SILICON NITRIDE CRYSTAL GRAINS THAT INCLUDE DISLOCATION DEFECT PORTIONS (%) | PERCENTAGE OF NUMBER OF SILICON NITRIDE CRYSTAL GRAINS IN WHICH OCCUPIED AREA RATIO IS 5% OR LESS (%) | KERNEL OF DISLOCATION DEFECT (ELEMENT OTHER THAN SILICON, OXYGEN, AND NITROGEN | |
| | | | EXISTENCE OR ABSENCE OF AGGREGATE OF 1 μm² OR MORE | EXISTENCE OR ABSENCE OF DEFECTION OF 10 mol % OR MORE |
| EXAMPLE 1 | 0 | — | NO | NO |
| EXAMPLE 2 | 2 | 100 | NO | NO |
| EXAMPLE 3 | 0 | — | NO | NO |
| EXAMPLE 4 | 4 | 100 | NO | NO |
| EXAMPLE 5 | 2 | 100 | NO | NO |
| EXAMPLE 6 | 0 | — | NO | NO |
| EXAMPLE 7 | 2 | 100 | NO | NO |
| REFERENCE EXAMPLE 1 | 36 | 100 | NO | NO |

TABLE 4

| | MAJOR DIAMETERS OF SILICON NITRIDE CRYSTAL GRAINS | | MAXIMUM SURFACE AREA OF GRAIN BOUNDARY PHASES (μm²) | THERMAL CONDUCTIVITY (W/m · K) | THREE-POINT BENDING STRENGTH (MPs) | BREAKDOWN VOLTAGE (kV/mm) |
|---|---|---|---|---|---|---|
| | MAXIMUM VALUE (μm) | AVERAGE VALUE (μm) | | | | |
| EXAMPLE 1 | 20 | 8 | 6 | 92 | 750 | 30 |
| EXAMPLE 2 | 15 | 7 | 5 | 90 | 790 | 28 |
| EXAMPLE 3 | 17 | 5 | 4 | 88 | 810 | 30 |
| EXAMPLE 4 | 13 | 6 | 4 | 85 | 820 | 30 |
| EXAMPLE 5 | 23 | 10 | 7 | 93 | 720 | 28 |
| EXAMPLE 6 | 21 | 7 | 4 | 94 | 770 | 32 |
| EXAMPLE 7 | 38 | 10 | 9 | 90 | 700 | 27 |
| REFERENCE EXAMPLE 1 | 29 | 15 | 13 | 83 | 700 | 25 |

In the silicon nitride substrates according to the examples, the percentage of the dislocation defect portions was 20% or less, and more favorably 10% or less. For the examples (the examples 2, 4, 5, and 7) in which dislocation defect portions were observed, the size of the kernel of the dislocation defect portion (an element other than silicon, oxygen, and nitrogen) was within the range of 0.2 μm or less. Also, for the kernels of the dislocation defect portions of the silicon nitride sintered bodies according to the examples, an element other than silicon, oxygen, and nitrogen was less than 10 mol %.

The maximum value of the major diameters of the silicon nitride crystal grains was 60 μm or less. For the silicon nitride substrates according to the examples, the maximum value of the surface areas of the grain boundary phases was 9 μm2 or less and was small compared to the reference example. Also, excellent values were obtained for the thermal conductivity, the three-point bending strength, and the breakdown voltage as well. Then, copper plates (having a thickness of 0.8 mm) were bonded to two surfaces of the silicon nitride substrates according to the examples and the Then, the front copper plates were patterned by etching. A cupric chloride solution was used to etch the copper plates. Also, an etching solution that included ammonium fluoride and hydrogen peroxide (H2O2) was used to etch the active metal brazing material layers.

In an etching condition 1, the pH of the etchant of the active metal brazing material was set to be within the range not less than 5.2 and not more than 5.8. In an etching condition 2, the pH of the etchant of the active metal brazing material was set to be within the range not less than 4.5 and not more than 5.0. Also, in the etching condition 2, a chemical polishing liquid that included hydrochloric acid and had a pH not less than 1 and not more than 2 also was used. In other words, in the etching using the etching condition 2, the silicon nitride substrate was damaged more easily compared to the etching condition 1.

The insulative properties of the silicon nitride substrate of the silicon nitride circuit board after the etching was compared to the insulative properties of the silicon nitride substrate of the silicon nitride circuit board before the etching; and the degradation rate was measured. The degradation rate of the insulation properties was measured by measuring the leakage current. The leakage current was measured by applying an alternating current voltage of 1.5 Kv-100 Hz between the front and back of the silicon nitride substrate described above under the conditions of a temperature of 25° C. and 70% humidity. The silicon nitride circuit board was good (○) if the change amount of the leakage current before and after etching was 5% or less. The silicon nitride circuit board was mediocre (Δ) if the change amount of the leakage current was greater than 5% and not more than 10%. Also, the silicon nitride circuit board was defective (×) if the change amount of the leakage current was greater than 10%. The results are shown in Table 5.

TABLE 5

| | INSULATION PROPERTY EVALUATION AFTER ETCHING | |
|---|---|---|
| | ETCHING CONDITION 1 | ETCHING CONDITION 2 |
| EXAMPLE 1 | ○ | ○ |
| EXAMPLE 2 | ○ | ○ |
| EXAMPLE 3 | ○ | ○ |
| EXAMPLE 4 | ○ | ○ |
| EXAMPLE 5 | ○ | ○ |
| EXAMPLE 6 | ○ | ○ |
| EXAMPLE 7 | ○ | Δ |
| REFERENCE EXAMPLE 1 | ○ | × |

For the silicon nitride substrates according to the examples, the degradation of the insulation properties was low after etching for both the etching conditions 1 and 2. For the silicon nitride substrate according to the reference example 1, the degradation of the insulative properties was low when etched using the etching condition 1. However, the degradation of the insulation properties was observed for etching using the etching condition 2. Also, for the silicon nitride substrate according to the example 7, the large grains were greater than 25 μm, and the surface area of the grain boundary phase was 9 μm2 and was large; therefore, the insulation properties slightly degraded when etched using the etching condition 2.

The etching condition 2 is necessary when the copper plate thickness is 0.8 mm or more. In other words, the etching condition 2 is favorable when etching a silicon nitride circuit board having a copper plate thickness of 0.8 mm or more.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. The above embodiments can be practiced in combination with each other.

What is claimed is:
1. A silicon nitride substrate comprising a silicon nitride sintered body including silicon nitride crystal grains and a grain boundary phase,
a plate thickness of the silicon nitride substrate being 0.4 mm or less,
a percentage of a number of the silicon nitride crystal grains including dislocation defect portions inside the silicon nitride crystal grains among any 50 of the silicon nitride crystal grains having completely visible contours in a 50 μm×50 μm observation region of any cross section or surface of the silicon nitride sintered body being not less than 0% and not more than 20%.
2. The silicon nitride substrate according to claim 1, wherein
the percentage is not less than 0% and not more than 10%.
3. The silicon nitride substrate according to claim 1, wherein
no aggregate of a component other than silicon, oxygen, and nitrogen is 1 μm$^2$ or more in the dislocation defect portion.
4. The silicon nitride substrate according to claim 1, wherein
no component other than silicon, oxygen, and nitrogen is detected to be 10 mol % or more in the dislocation defect portion.
5. The silicon nitride substrate according to claim 1, wherein
a percentage of a number of the silicon nitride crystal grains having an occupied area ratio of the dislocation defect portion of 5% or less among the number of the silicon nitride crystal grains including the dislocation defect portions is 70% or more.
6. The silicon nitride substrate according to claim 1, wherein
a maximum value of major diameters of the silicon nitride crystal grains in a 300 μm×300 μm observation region of any cross section of the silicon nitride sintered body is 60 μm or less.
7. The silicon nitride substrate according to claim 1, wherein
an average of major diameters of the silicon nitride crystal grain in a 300 μm×300 μm observation region of any cross section of the silicon nitride sintered body is within a range not less than 1 μm and not more than 10 μm.
8. The silicon nitride substrate according to claim 1, wherein
a surface area of each of the grain boundary phases in a 300 μm×300 μm observation region of any cross section of the silicon nitride sintered body is 9 μm$^2$ or less.
9. The silicon nitride substrate according to claim 1, wherein
the plate thickness is not less than 0.10 mm and not more than 0.30 mm.
10. The silicon nitride substrate according to claim 1, wherein
a breakdown voltage of the silicon nitride substrate is 25 kV/mm or more.
11. The silicon nitride substrate according to claim 1, wherein
a thermal conductivity of the silicon nitride substrate is 80 W/(m·K) or more.
12. The silicon nitride substrate according to claim 1, wherein
a three-point bending strength of the silicon nitride substrate is 600 MPa or more.
13. A silicon nitride circuit board, comprising:
the silicon nitride substrate according to claim 1; and
a circuit part provided on the silicon nitride substrate.

14. The silicon nitride circuit board according to claim 13, wherein
the circuit part is a metal plate having a thickness of 0.8 mm or more.

15. The silicon nitride circuit board according to claim 13, wherein
the circuit part is patterned into a pattern shape by etching.

16. The silicon nitride substrate according to claim 1, wherein
no aggregate of a component other than silicon, oxygen, and nitrogen is 1 µm² or more in the dislocation defect portion,
a percentage of a number of the silicon nitride crystal grains having an occupied area ratio of the dislocation defect portion of 5% or less among the number of the silicon nitride crystal grains including the dislocation defect portions is 70% or more, and
a maximum value of major diameters of the silicon nitride crystal grains in a 300 µm×300 µm observation region of any cross section at the silicon nitride sintered body is 60 µm or less.

17. The silicon nitride substrate according to claim 1, wherein
no component other than silicon, oxygen, and nitrogen is detected to be 10 mol % or more in the dislocation defect portion,
a percentage of a number of the silicon nitride crystal grains having an occupied area ratio of the dislocation defect portion of 5% or less among the number of the silicon nitride crystal grains including the dislocation detect portions is 70% or more, and
a maximum value of major diameters of the silicon nitride crystal grains in a 300 µm×300 µm observation region of any cross section of the silicon nitride sintered body is 60 µm or less.

* * * * *